(12) United States Patent
Taniguchi

(10) Patent No.: US 6,891,254 B2
(45) Date of Patent: May 10, 2005

(54) SEMICONDUCTOR DEVICE WITH PROTRUSIONS

(75) Inventor: Jun Taniguchi, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 30 days.

(21) Appl. No.: 10/324,938

(22) Filed: Dec. 20, 2002

(65) Prior Publication Data

US 2003/0124775 A1 Jul. 3, 2003

(30) Foreign Application Priority Data

Dec. 28, 2001 (JP) .......................................... 2001-400232

(51) Int. Cl.[7] .............................................. H01L 23/495
(52) U.S. Cl. ....................... 257/667; 257/676; 257/787; 438/121; 438/123; 438/124; 438/127
(58) Field of Search ................................ 257/667, 676, 257/787; 438/121, 123, 124, 127

(56) References Cited

U.S. PATENT DOCUMENTS

| | | | |
|---|---|---|---|
| 5,578,871 A | * 11/1996 | Fierkens | 257/676 |
| 5,750,423 A | * 5/1998 | Ishii | 438/112 |
| 5,864,174 A | 1/1999 | Yamada et al. | 257/676 |
| 6,331,448 B1 | * 12/2001 | Ahmad | 438/112 |
| 6,639,306 B2 | * 10/2003 | Huang | 257/667 |

* cited by examiner

Primary Examiner—Richard Elms
Assistant Examiner—Christian D. Wilson
(74) Attorney, Agent, or Firm—Mark P. Watson

(57) ABSTRACT

A sealing process in a manufacturing method for semiconductor devices improves product reliability. A die pad 14 with a semiconductor chip 32 mounted thereon is placed between first and second molding dies 40, 42 such that the die pad 14 is supported above the second molding die 42. A sealant 30 is then injected between the first and second molding dies 40, 42 to seal the semiconductor chip 32. Part of the die pad 14 has one or more protrusions 16 projecting in the direction of the second molding die 42. Injecting the sealant 30 presses the protrusions 16 against the second molding die 42 and seals the semiconductor chip 32.

4 Claims, 9 Drawing Sheets (A)

(B)

(A)

(B)

SEMICONDUCTOR DEVICE WITH PROTRUSIONS

BACKGROUND OF THE INVENTION

1. Field of the Invention

The present invention relates to a semiconductor device, a manufacturing method for a semiconductor device, a circuit board, and an electronic device.

2. Description of the Related Art

One of the steps in the manufacture of semiconductor devices involves placing the lead frame in a mold and then injecting a sealant into the mold cavity in order to encapsulate the semiconductor chip. The semiconductor chip is mounted on the die pad of the lead frame. The die pad is held floating above the bottom tool of the mold for devices in which the die pad is not exposed. The sealant is injected from an edge of the cavity.

The sealant, however, often travels first around either the top or the bottom of the die pad, causing the die pad to shift up or down. If the die pad shifts too far down, for example, the back of the die pad may be exposed from the sealant, resulting in a defective product. This problem of the sealant first covering the top of the die pad, pushing the die pad down and leaving the back of the die pad exposed often occurs when a thin chip is mounted on the die pad.

OBJECTS OF THE INVENTION

The present invention is directed to solving this problem, and an object of the invention is to provide a sealing process able to improve product reliability.

SUMMARY OF THE INVENTION

To achieve this object, a manufacturing method for a semiconductor device according to the present invention positions a die pad having a semiconductor chip mounted thereon between first and second molding dies such that the die pad is supported above the second molding die, and seals the semiconductor chip by injecting a sealant between the first and second molding dies. Part of the die pad includes a protrusion extending toward the second molding die. Injecting the sealant causes the protrusion to press against the second molding die as the semiconductor chip is sealed.

When the pressure of the sealant flowing into the mold cavity causes the die pad to shift in the direction of the second molding die, the protrusions from the die pad are pressed against the die and thus prevent the entire back of the die pad from being exposed (i.e. not covered by the sealant). A sealing process that improves the reliability of the product can thus be used.

The protrusions are preferably formed at an edge part of the die pad.

Yet further preferably in the sealing step the end of the protrusion contacts the second molding die at substantially a point. This minimizes the area of the protrusion that is exposed (not covered by the sealant).

The protrusion can be located inside or outside the mounting area of the semiconductor chip.

The protrusion can be formed as a convex part bent vertically toward the second molding die by extending the die pad.

Alternatively, the protrusion can be formed as part of the die pad by down-setting the die pad in a one-ton press process.

A simple process can thus be used to form the protrusions.

The protrusion can be formed by bending the edge of the die pad in the direction of the second molding die.

The die pad could also have multiple protrusions. In this case the multiple protrusions will be pressed against the second molding die, thereby reliably preventing the entire back of the die pad from being exposed. Hereinafter, "exposed" means "not covered by the sealant."

A semiconductor device according to the present invention includes a semiconductor chip, a die pad on which the semiconductor chip is mounted, and a sealant for sealing the semiconductor chip. Part of the die pad is a protrusion projecting away in the direction opposite from the side on which the semiconductor chip is mounted, and the end of the protrusion is exposed.

The protrusion is preferably formed at an edge part of the die pad, and further preferably tapers to a narrow end.

The protrusion can be positioned inside or outside the mounting area of the semiconductor chip.

The protrusion can be formed by extending the die pad as a convex part bent vertically. The protrusion could also be a bend from an edge part of the die pad.

The die pad preferably has a plurality of protrusions.

A circuit board according to the present invention has mounted thereon a semiconductor device as described above.

An electronic device according to the present invention has a semiconductor device as described above.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Preferred embodiments of the present invention are described below with reference to the accompanying figures.

It should be noted that the present invention is not limited to the following embodiments.

Embodiment 1

Figure 1:
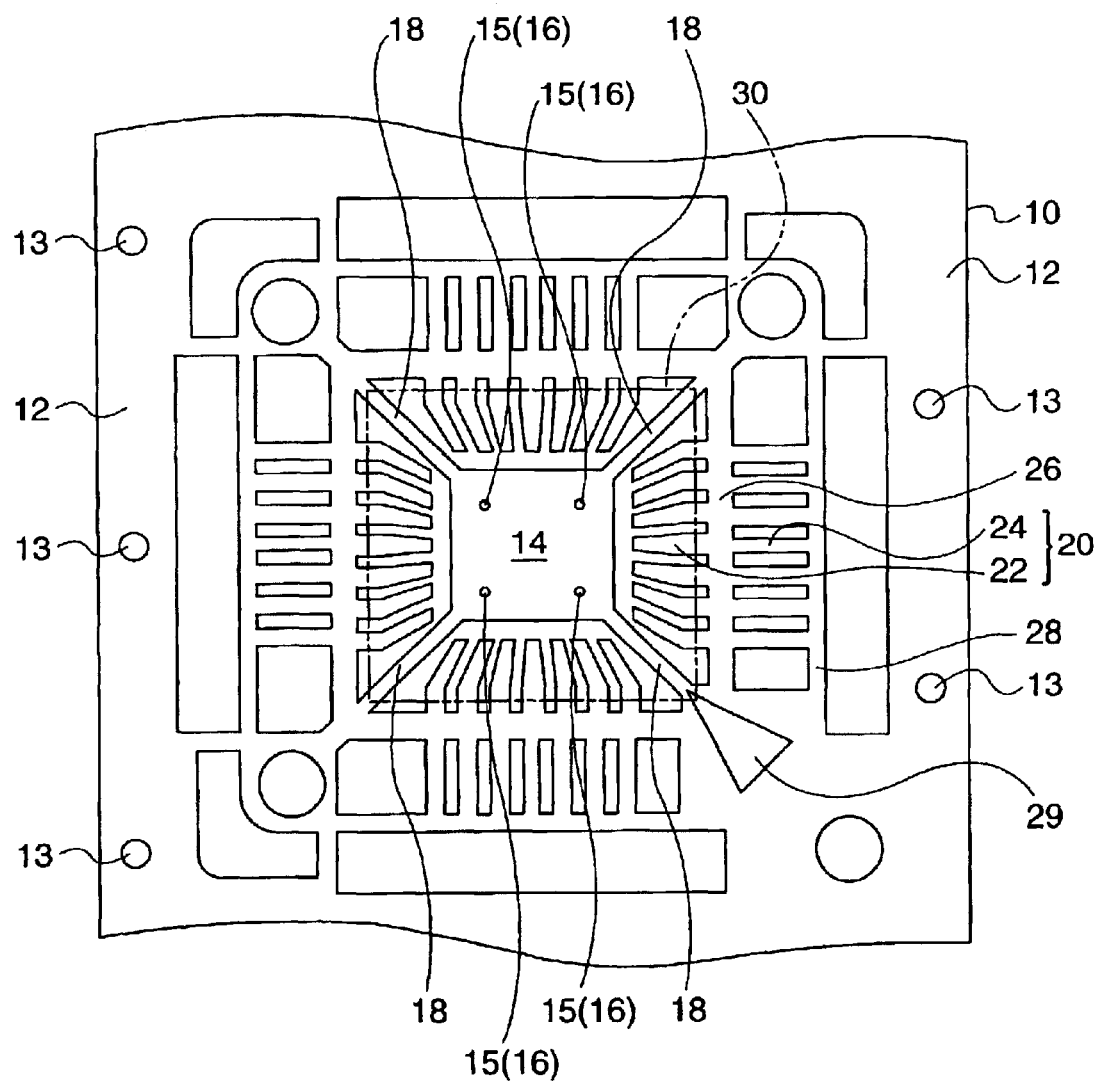
FIG. 1 shows a lead frame according to a first embodiment of the invention.
Figure 2:
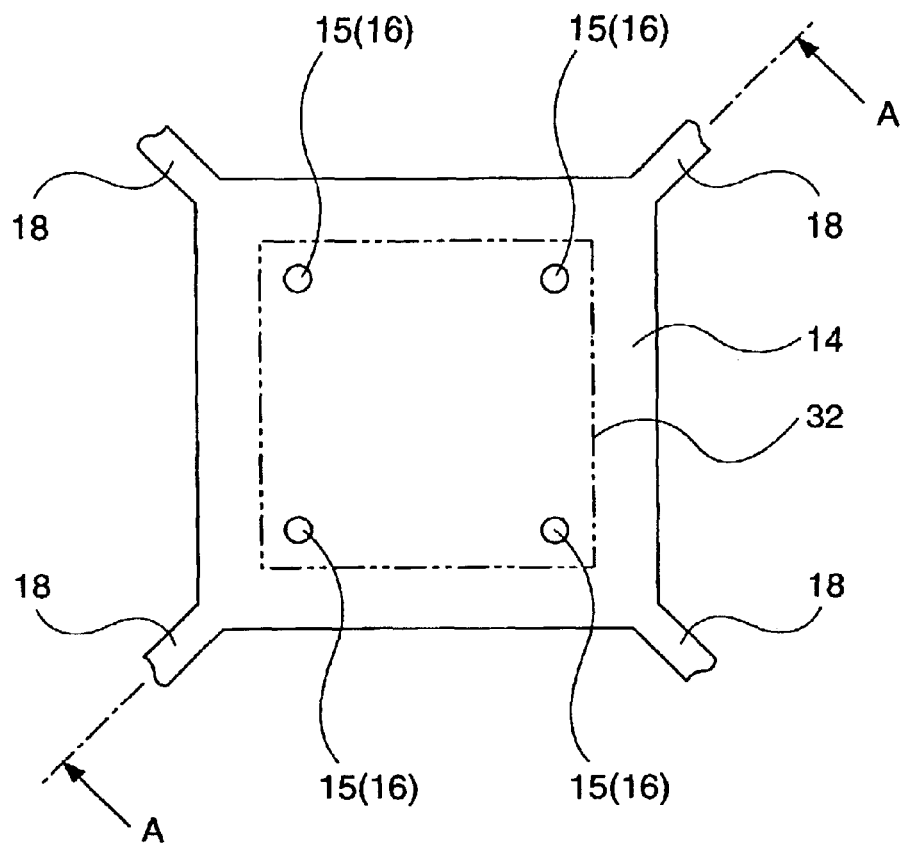
FIG. 2 is an enlarged view of a lead frame according to a first embodiment of the invention.
Figure 3:
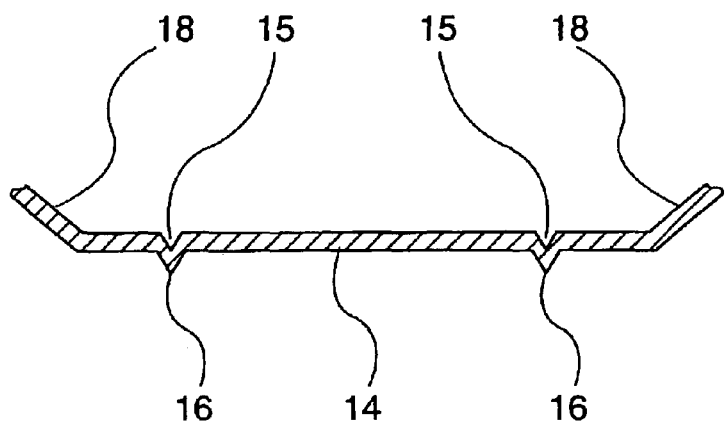
FIG. 3 is a section view through A—A in FIG. 2.

FIG. 1 to FIG. 8(B) show a first embodiment of the invention. FIG. 1 shows a lead frame used in the present embodiment, FIG. 2 is a plan view of the die pad in FIG. 1, and FIG. 3 is a cross section through A—A in FIG. 2.

The lead frame 10 is made by processing a copper or ferrous plate by such methods as chemical etching or mechanical stamping. The lead frame 10 has an outside frame 12. The outside frame 12 is often rectangular, and the shape of the outside frame 12 defines the outside shape of the lead frame 10.

The outside frame 12 has at least one hole (tool hole) 13 for easier positioning of the lead frame 10 to the molding die. At least one such hole 13 is preferably formed on each side of the outside frame 12. In this case the hole 13 formed on one side of the outside frame 12 (e.g., the left side in FIG. 1) is preferably offset in the lengthwise direction of the outside frame 12 (top to bottom direction as seen in FIG. 1) from the hole 13 formed on the other side (e.g., the right side in FIG. 1). This makes it easier to set the lead frame 10 in the die without mistaking the correct orientation.

The lead frame 10 preferably has at least one die pad (or island) 14. (Only one die pad 14 is shown in FIG. 1 but there are usually plural.) The die pad 14 is the part where the semiconductor chip or other electronic part is mounted, and is usually rectangular (a rectangle or a square). The die pad 14 is supported on the outside frame 12 by suspension pins (tie bars or suspension leads) 18. As shown in FIG. 3, the suspension pins 18 are curved or angled and the die pad 14 is down set (depressed).

The die pad 14 also has one or multiple protrusions 16 (four are shown in FIG. 1). The protrusions 16 are part of the die pad 14 and are formed by processing the die pad 14. The protrusions 16 extend on the side opposite from the side of the die pad 14 (the front) on which the semiconductor chip 32 is mounted (i.e., they extend from the back side of the die pad 14). The protrusions 16 also protrude more than other parts on the back of the die pad 14. It should be noted that dimples 15 are formed on the front of die pad 14 at the same plane positions as the protrusions 16.

As shown in FIG. 2 the protrusions 16 can be formed at the edge parts of the die pad 14. In FIG. 2 the protrusions 16 are formed at the corners of the die pad 14. In this case there is preferably one at each of the four corners. This prevents the die pad 14 from tilting during the sealing process. The protrusion 16 could alternatively be formed in the middle of the die pad 14, or at both the edges and in the middle.

As also shown in FIG. 2 the protrusions 16 can be located on the inside of the area where the semiconductor chip 32 is placed. In this case the protrusions 16 can further be located at the corners of the semiconductor chip 32 area.

As shown in FIG. 3 the protrusions 16 can be tapered to a narrow tip. The protrusions 16 could, for example, taper to an acute point (such as a conical cone or a pyramid shape). This minimizes the area of the protrusions 16 that is exposed, i.e. not covered by the sealant 30. As mentioned previously, "exposed" in the context of the present invention means "not covered by the sealant 30." The protrusions 16 could alternatively be shaped like the frustum of a circular cone or pyramid. Further, alternatively the protrusions 16 could be convex projections perpendicular to the surface of the die pad 14.

As shown in FIG. 3, the protrusions 16 could be convex bent parts protruding from the die pad 14. That is, the protrusions 16 can be formed by punch forming. Punch forming forms convex shapes by reducing the thickness and increasing the area of the die pad 14. The protrusions 16 could also be formed using a combination of punch forming and drawing. The protrusions 16 could also be formed by press processing.

As shown in FIG. 1 the lead frame 10 has multiple leads 20. The leads 20 extend from the outside frame 12 toward the die pad 14. The leads 20 more specifically include inner leads 22 and outer leads 24. The inner leads 22 are the part sealed in the sealant 30 in the semiconductor device as indicated by the double-dot dash line, and the outer leads 24 are the part projecting from the sealant 30 and used for external electrical connection.

The outer leads 24 extend perpendicularly to the sides of the rectangular die pad 14. The inner leads 22 extend at an angle from the outer leads 24 to the middle of the die pad 14. Adjacent leads 20 are connected by a dam bar 26. More specifically, the dam bars 26 connect adjacent outer leads 24 at the parts thereof near the inner leads 22.

Adjacent outer leads 24 are connected by a connecting part 28. More specifically, a group of outer leads 24 extending from one side of the rectangular die pad 14 are connected by a connecting part 28 perpendicular to the outer leads 24. The outer leads 24 can thus be said to extend from the connecting part 28 toward the die pad 14. The connecting part 28 is supported by the outside frame 12 on both sides in the direction that the outer leads 24 extend.

Figure 4:
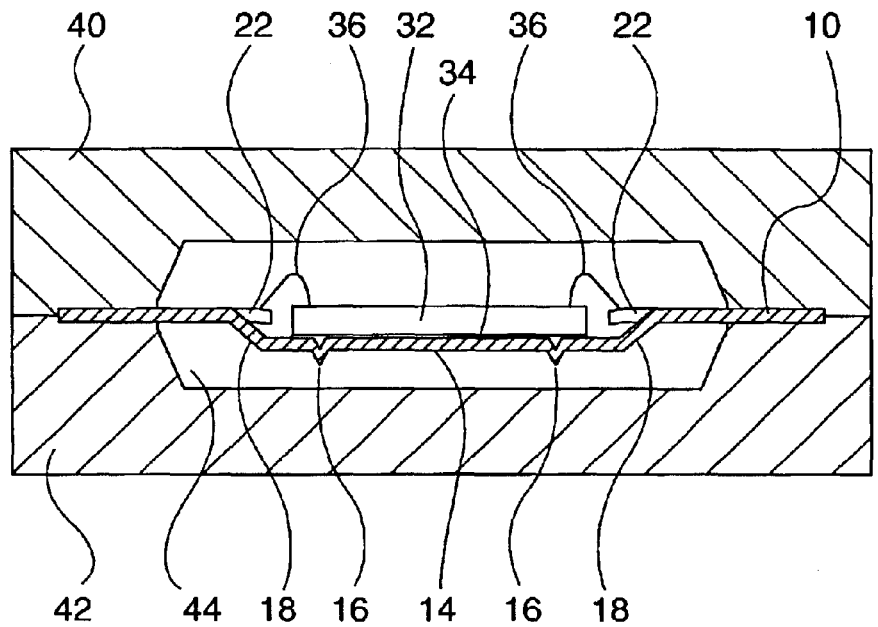
FIGS. 4(A) and (B) show a semiconductor device manufacturing method according to a first embodiment of the invention.
Figure 4:
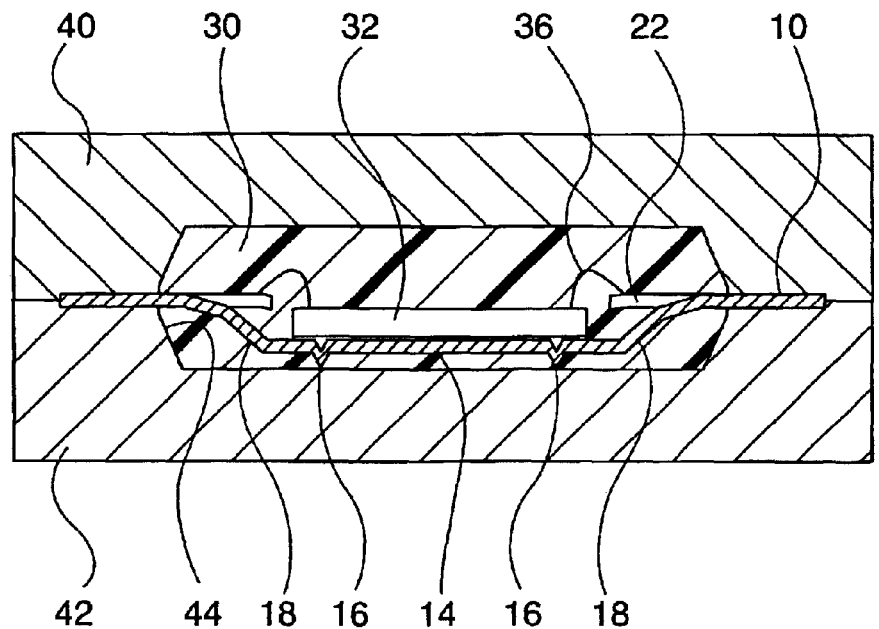
Figure 5:
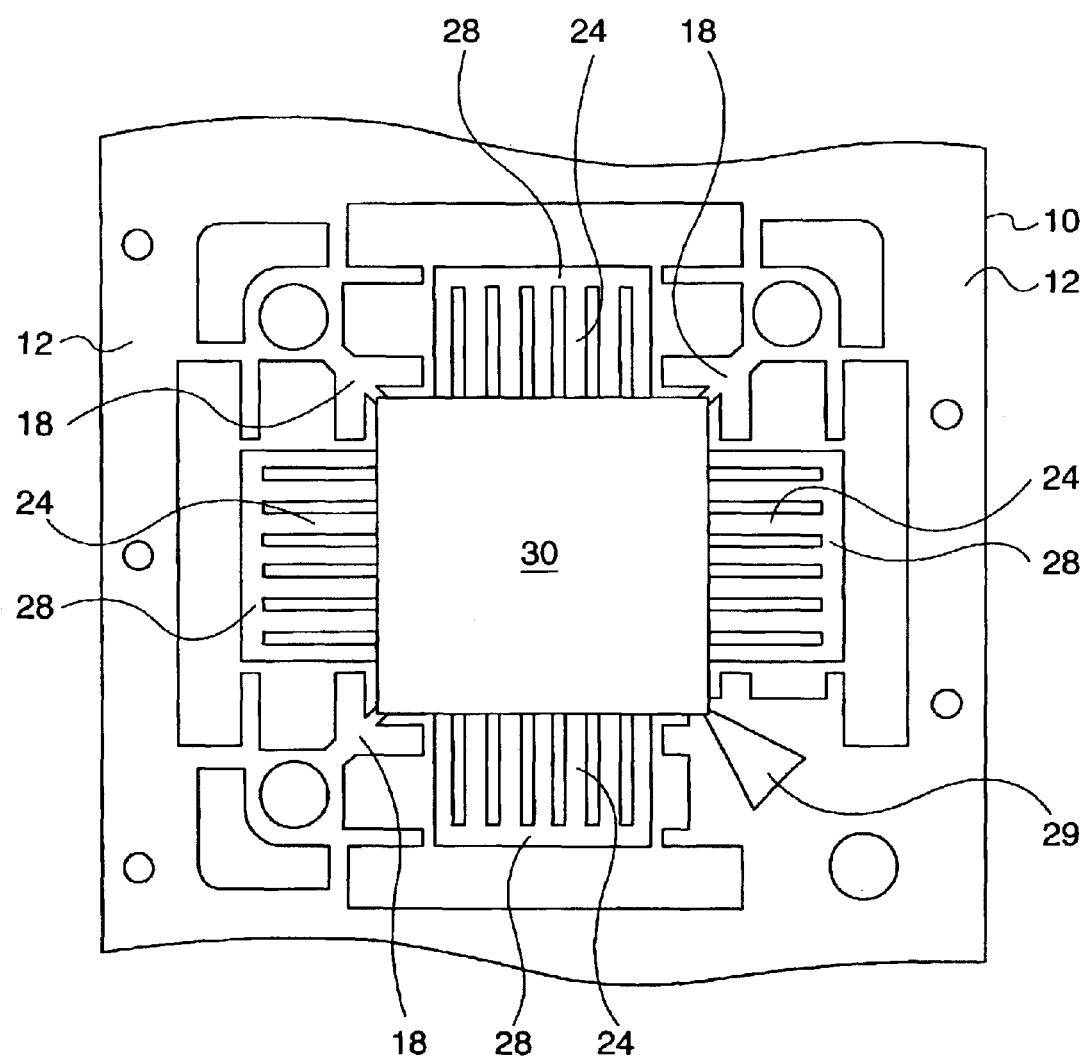
FIG. 5 shows a semiconductor device manufacturing method according to a first embodiment of the invention.

A semiconductor device manufacturing method according to the present invention produces a semiconductor device using this lead frame 10. FIG. 4 and FIG. 5 are referenced below to describe a semiconductor device manufacturing method according to the present invention.

The first step is die bonding. A semiconductor chip 32 is fixed on the die pad 14 of the lead frame 10. More specifically, the semiconductor chip 32 is mounted face up on the die pad 14. The semiconductor chip 32 is, for example, bonded to the die pad 14 with adhesive 34. A thermosetting resin could be used for the adhesive 34, but a material with high heat conductivity, such as a metal paste (such as silver paste) may be used.

Next comes wire bonding. This step electrically connects the inner leads 22 to the pad (not shown in the figure) of the semiconductor chip with wire 36, for example. This wire 36 is often gold wire.

A sealing process (molding process) follows next as shown in FIG. 4(A) and FIG. 4(B). The lead frame 10 is set in the first and second molding dies 40, 42. The first molding die 40 here is the top die (top mold) and the second molding die 42 is the bottom die (bottom mold). The lead frame 10 is placed between the first and second molding dies 40, 42, and the mold is then closed to hold the lead frame 10 (specifically the outside frame 12) between the first and second molding dies 40, 42. A recess is formed in each of the first and second molding dies 40, 42 and the mold cavity 44 is formed by these recesses. The die pad 14 is positioned raised above the second molding die 42 inside the cavity 44. Suspension pins 18 support the die pad 14, enabling the down-set (i.e. downward position relative to second molding die 42) to be easily changed.

As shown in FIG. 4(B) the sealant 30 is then injected to the cavity 44 to seal the semiconductor chip 32, wires 36, and inner leads 22. The sealant 30 is often a resin such as a thermosetting resin. The sealant 30 is injected from a gate (not shown in the figure) communicating with the side edge of the cavity 44. The gate can be above or below the lead frame 10, or it could be a center gate disposed both above and below the lead frame 10. When a center gate is used a hole 29 is formed in the lead frame 10 at the gate position as shown in FIG. 1.

Injecting the sealant 30 pushes the protrusions 16 against second molding die 42. More specifically, the pressure of the in-flowing sealant 30 causes the die pad 14 to move downward within cavity 44. If multiple protrusions 16 are formed on the die pad 14 all of the multiple protrusions 16 can be pressed against the second molding die 42. This reliably prevents the entire back of the die pad 14 from being exposed since it remains well within cavity 44 and is covered by the sealant. The ends of the protrusions 16 preferably contact the second molding die 42 at a point (including when the ends are round). This minimizes the area exposed, with the area not covered by the sealant 30 being confined to the ends of the protrusions 16.

Any one of the multiple protrusions 16 can be located at the corner on the gate side of the die pad 14. The protrusions 16 can also be positioned so that all are located away from the corner on the gate side of the die pad 14.

Even if the die pad 14 is shifted (pressed) towards the second molding die 42 by the pressure of the in-flowing sealant 30 in this sealing process, the protrusions 16 stop against the second molding die 42 and then prevent the entire back side of the die pad 14 from being exposed. The present invention is particularly effective when a thin semiconductor chip 32 is mounted on the semiconductor chip 32 and the die pad 14 tends to easily shift downward as a result of the sealant 30 travelling first to the semiconductor chip 32 side of the die pad 14. The sealing process therefore does not need to compensate for vertical displacement of the die pad 14.

This means that the die pad 14 can be designed with a large down-set, and it is not necessary to lower the viscosity of the sealant 30. In addition, the occurrence of bubbles (voids) inside the cavity 44 can be reduced or even eliminated because it is not necessary to lower sealant 30 viscosity. Design freedom is thus increased and product reliability can be improved.

A dam bar cutting process follows the sealing process as shown in FIG. 5. More specifically, the dam bar 26 (see FIG. 1) is cut near the sealant 30. It should be noted that burrs are preferably removed from the sealant 30 after the sealing process. Burr removal can be part of the dam bar cutting process.

A plating process follows next using, for example, electrolytic plating. More specifically, a brazing material (such as solder) or tin or other metallic film is formed on the part of the lead frame 10 that is not covered by the sealant 30. For example, the multiple outer leads 24 are connected to the outside frame 12 by connecting part 28, are electrically connected via the outside frame 12, and can therefore be electrolytically plated. Corrosion resistance is improved by thus forming metal plating. Furthermore, if the solder or other brazing material is plated, the outer leads 24 can be connected more easily to the wiring pattern.

The part of outer lead 24 connecting parts 28 connected to the outside frame 12 is then cut after the plating process as shown in FIG. 5. In this case, as shown in FIG. 1, the outer leads 24 are preferably connected by connecting part 28. This enables simultaneously forming connected groups of outer leads 24 in the forming process. The outer leads 24 can thus be prevented from bending in the horizontal direction.

A lead frame 10 as shown in FIG. 5 is thus manufactured. The sealant 30 supports multiple outer leads 24, and is connected by suspension pins 18 to outside frame 12. Multiple sealing parts 30 can thus be handled with a single lead frame 10.

Figure 6:
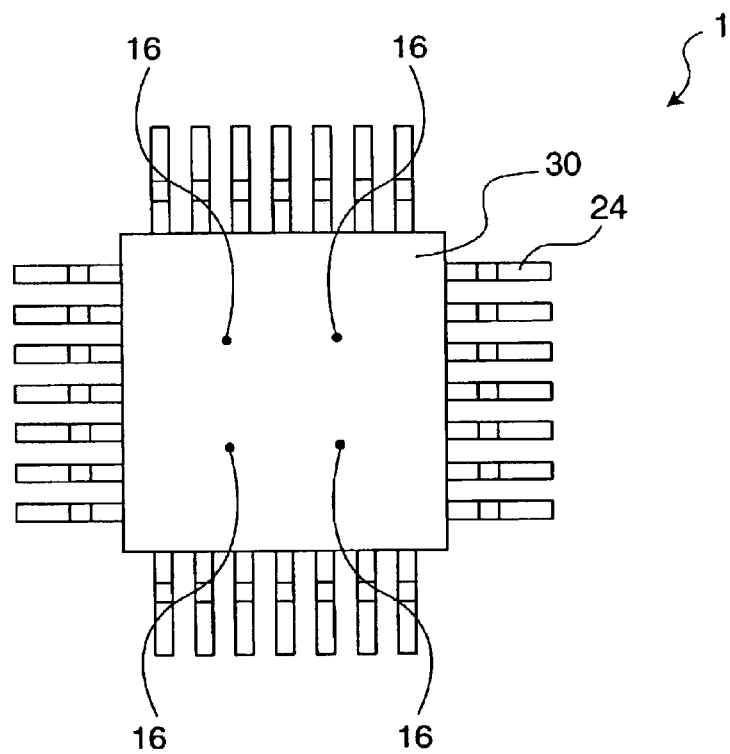
FIG. 6 shows a semiconductor device according to a first embodiment of the invention.
Figure 7:
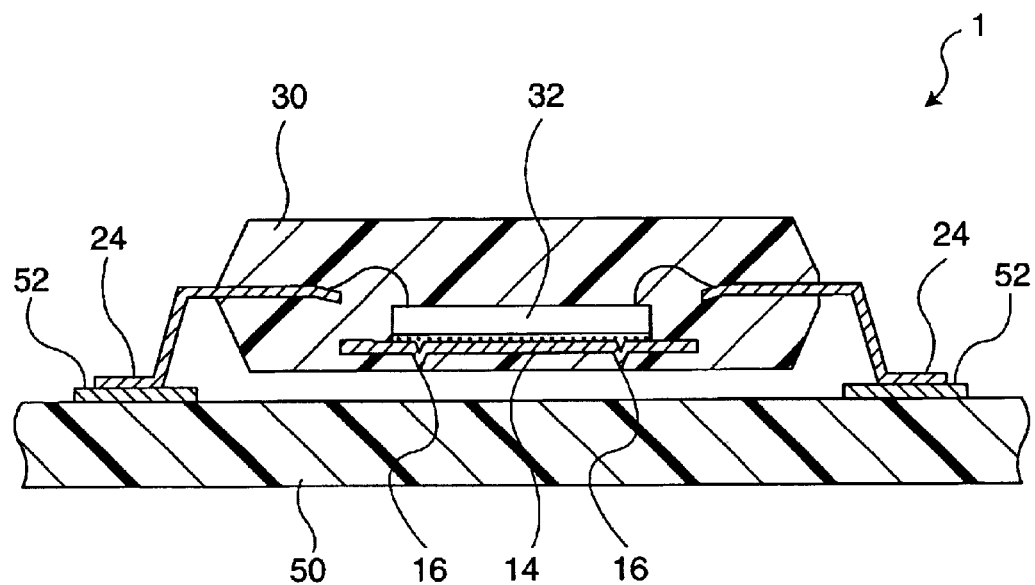
FIG. 7 shows a circuit board on which is mounted a semiconductor device according to a first embodiment of the invention.
Figure 8:
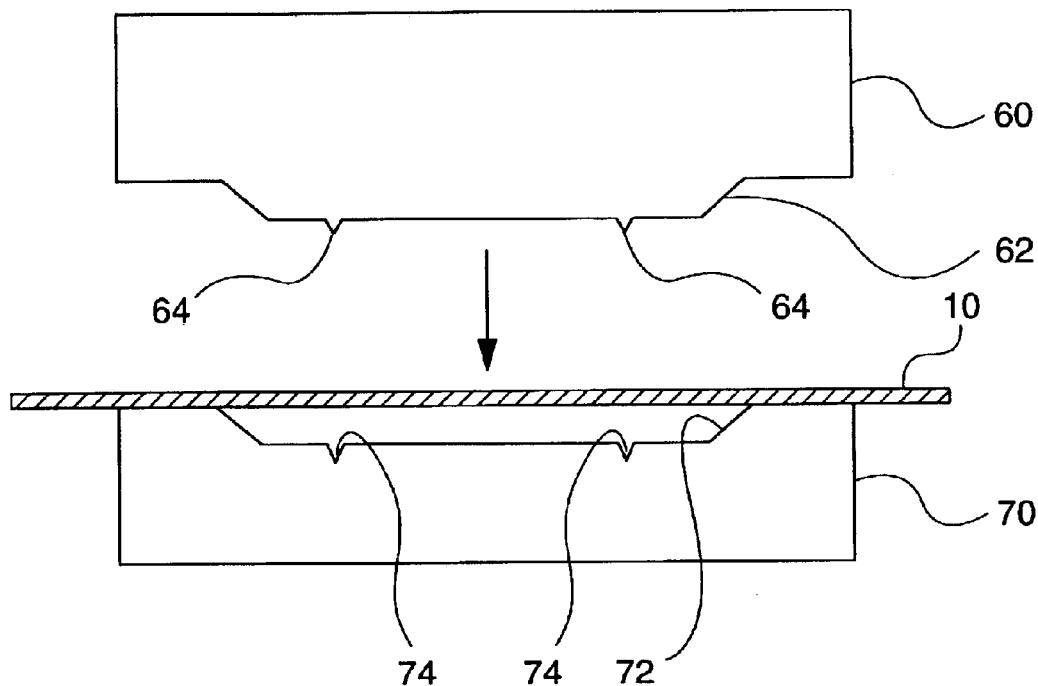
FIGS. 8(A) and (B) show a lead frame manufacturing method according to a first embodiment of the invention.
Figure 8:
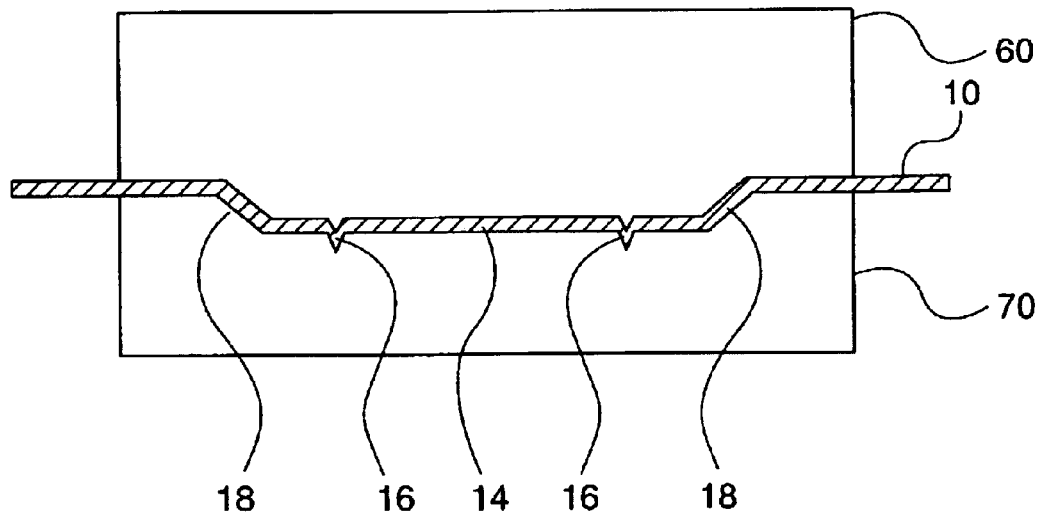

Other processes are then applied (such as trimming, forming, and marking) to produce a semiconductor device as shown in FIG. 6 (or FIG. 7). FIG. 6 is a plan view (as seen from the back) of a semiconductor device manufactured by the method of the present invention. FIG. 7 shows a circuit board on which is mounted a semiconductor device manufactured by the method of this invention.

The semiconductor device 1 includes a semiconductor chip 10, a die pad 14 having the above-described protrusions 16, and sealant 30. As shown in FIG. 6 the tips of the protrusions 16 are exposed, extending out of the sealant 30, and the outer leads 24 are bent to a specific shape (such as a gull wing shape).

A semiconductor device according to a preferred embodiment of the invention includes configurations derived from any of the selected characteristic elements of the semiconductor device manufacturing method described above. The effects of a semiconductor device according to the present invention are as described above.

As shown in FIG. 7 a glass epoxy substrate or other organic substrate is generally used for the circuit board 50. A wiring pattern 52 of copper or other conductor is formed to make the desired circuits on the circuit board 50, and the outer leads 24 of the semiconductor device are bonded to the wiring pattern 52.

FIG. 8(A) and FIG. 8(B) show a lead frame manufacturing method according to a preferred embodiment of the invention. The above-described semiconductor device manufacturing method includes lead frame manufacture. In this embodiment of the invention the protrusions 16 are formed by a mechanical press process. More specifically, the protrusions 16 are formed by punch forming, drawing, or a combination of these techniques.

First, as shown in FIG. 8(A), first and second molding dies 60, 70 are made. In this example the first molding die 60 is the top die and the second molding die 70 is the bottom tool. The first molding die 60 has a first convex part 62 for down-setting the die pad 14, and a second convex part 64 for forming the protrusions 16 in die pad 14. The second molding die 70 has a first recess 72 for down-setting the die pad 14, and a second recess 74 for forming the protrusions 16 in die pad 14.

The lead frame 10 is placed between first and second molding dies 60, 70 and the lead frame 10 is then pressed between first and second molding dies 60, 70. More specifically, a one-ton press process down-sets (depresses) the die pad 14 and forms the protrusions 16. The protrusions 16 can thus be easily formed and production cost can be kept low.

It will be evident that forming the protrusions 16 shall not be limited to the above-described method. The protrusions 16 could, for example, be formed by chemical etching or by plating processes that build up metal layers.

Embodiment 2

Figure 9:
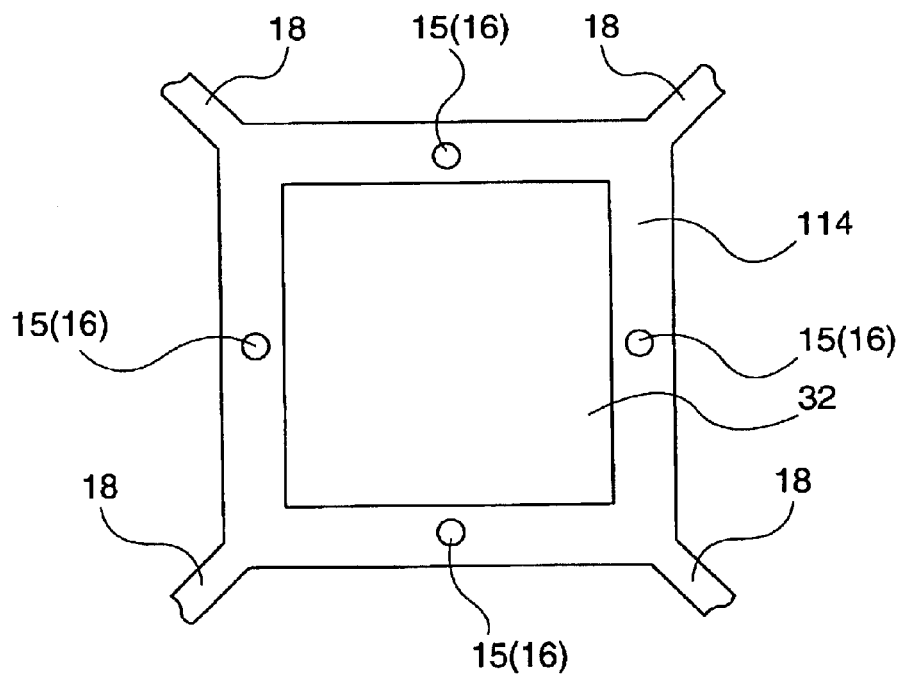
FIG. 9 is an enlarged view of a lead frame according to a second embodiment of the invention.

FIG. 9 is a plan view of a die pad in a second preferred embodiment of the present invention. The protrusions 16 are formed at different positions on the die pad 114 in this embodiment than in the above first embodiment. The embodiment shown in FIG. 9 has dimples 15 formed on the side of die pad 114 to which semiconductor chip 32 is mounted at the same plane positions as the protrusions 16.

As shown in FIG. 9 a plurality of protrusions 16 is formed at the edges of the die pad 114. More specifically, each of the protrusions 16 is formed on one of the sides at a position removed from the corners. The protrusions 16 can thus be formed in the middle of each side as shown in FIG. 9. The protrusions 16 are preferably formed on all sides of the die pad 114. This prevents the die pad 114 from tilting during the sealing process.

As shown in FIG. 9 the protrusions 16 can be located outside the area where semiconductor chip 32 is mounted.

It should be noted that a semiconductor device and manufacturing method according to the present invention can contain any of the features selected from the above embodiment, and the effects thereof will be the same as described above.

Embodiment 3

Figure 10:
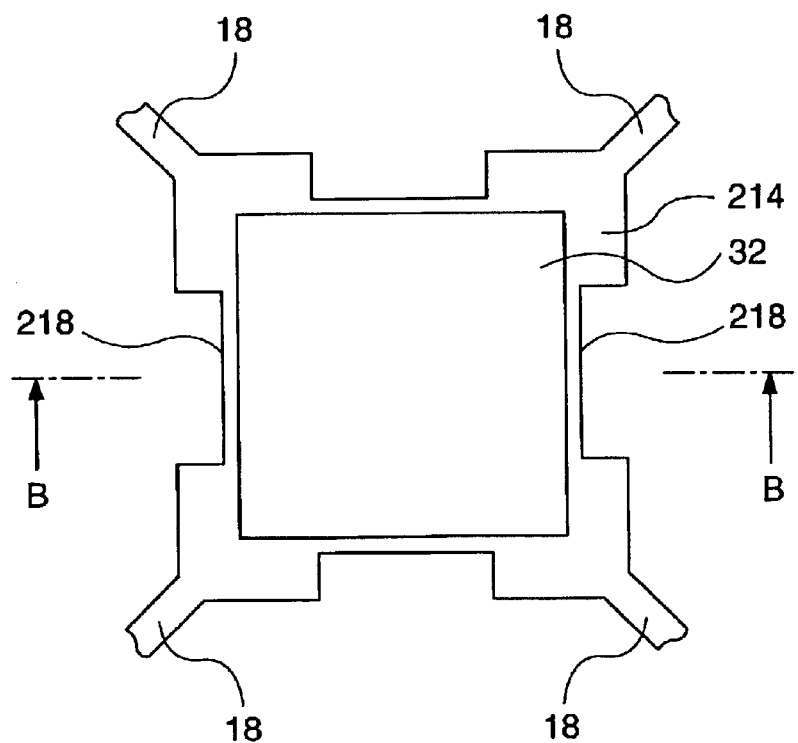
FIG. 10 is an enlarged view of a lead frame according to a third embodiment of the invention.
Figure 11:
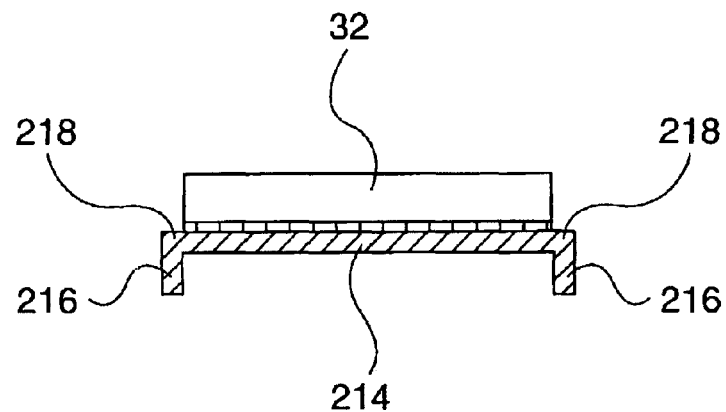
FIG. 11 is a section view through B—B in FIG. 10.

FIG. 10 and FIG. 11 show a third embodiment of the invention. FIG. 10 is a plan view of the die pad, and FIG. 11 is a section view through B—B in FIG. 10. This embodiment differs from the above in the configuration of the protrusions 216 formed on the die pad 214.

As shown in FIG. 11 the protrusions 216 can be formed by bending part of the edges of the die pad 214 away from the side on which the semiconductor chip 32 is mounted. To make the edge part of the die pad 214 easier to bend, part of the die pad 214 can be removed. For example, a notch can be formed in each side of the die pad 214 and the protrusions 216 formed by bending the free ends at the connecting parts 218. The connecting parts 218 can be the long sides of the parts that become the free ends (the part that becomes the protrusions 216) as shown in the figure, or the short sides.

The protrusions 216 can be long slender forms with the same continuous longitudinal section. In this case the edges of the protrusions 216 can substantially linearly contact (including contact at the die pad section) the second molding die.

It should be noted that a semiconductor device and manufacturing method according to the present invention can contain any of the features selected from the above embodiment, and the effects thereof will be the same as described above.

Figure 12:
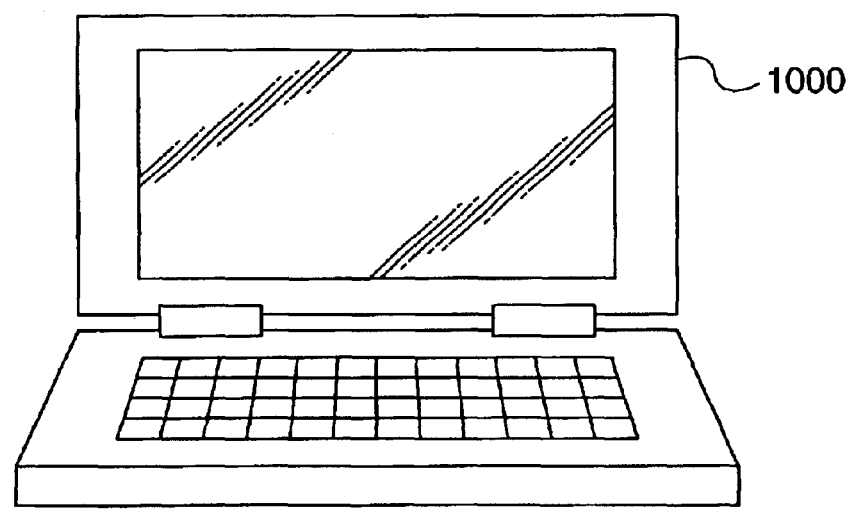
FIG. 12 shows an electronic device according to an embodiment of the invention.
Figure 13:
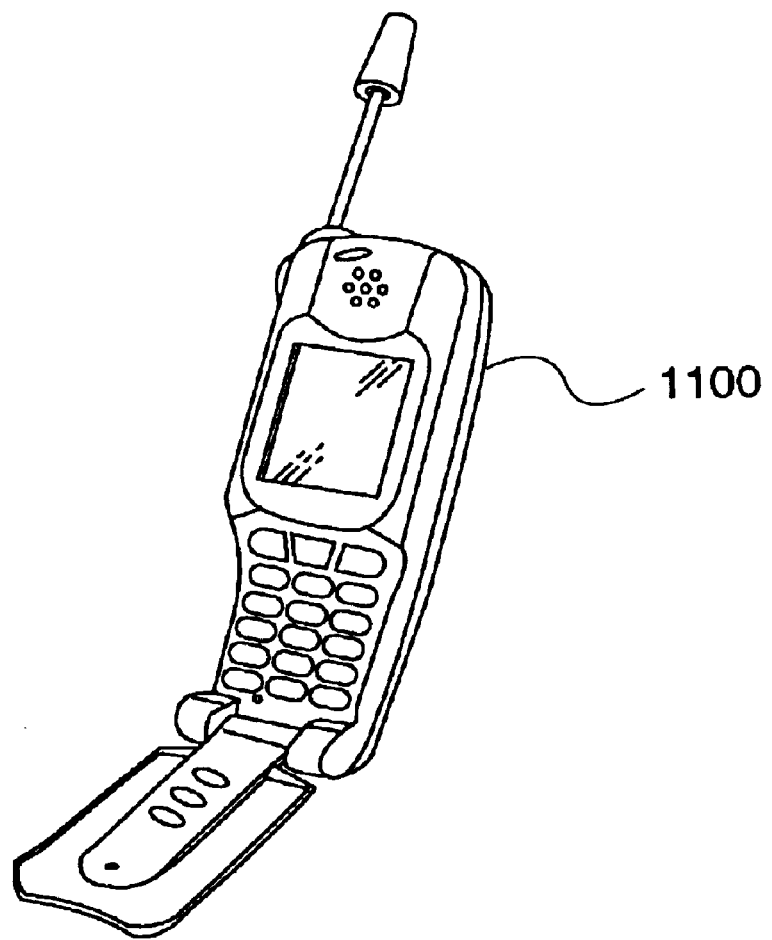
FIG. 13 shows another electronic device according to an embodiment of the invention.

Examples of an electronic device using a semiconductor device according to the present invention are a notebook type personal computer as shown in FIG. 12 and a cell phone as shown in FIG. 13.

The present invention shall not be limited to the embodiments described above, and can be varied in many ways. For example, the present invention includes configurations (such as configurations that are the same in function, method, and result, and configurations that are the same in object and result) that are substantively identical in configuration to the above-described embodiments. The present invention also includes configurations in which parts not fundamental to the configurations described above are replaced. The present invention also includes configurations that achieve the same object or operational effect as the configurations described above. This invention also includes configurations adding known technology to the embodiments of the invention described above.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor device including a semiconductor chip, a die pad on which the semiconductor chip is mounted on one side, and a sealant that seals the semiconductor chip, comprising:

a plurality of protrusions on part of the die pad, the protrusions being positioned inside and at the corners of a rectangular semiconductor chip mounting area, at least one protrusion in each corner;

each protrusion comprising a convex portion formed by punch forming and projecting away in the direction opposite from the side on which the semiconductor chip is mounted; and each protrusion including an exposed end uncovered by the sealant.

2. A semiconductor device as described in claim 1, wherein each protrusion is tapered to a narrow end.

3. A circuit board including a semiconductor device mounted thereon, the semiconductor device including a semiconductor chip, a die pad on which the semiconductor chip is mounted on one side, and a sealant that seals the semiconductor chip, the semiconductor device comprising:

a plurality of protrusions on part of the die pad, the protrusions being positioned inside and at the corners of a rectangular semiconductor chip mounting area, at least one protrusion in each corner;

each protrusion comprising a convex portion formed by punch forming and projecting away in the direction opposite from the side on which the semiconductor chip is mounted; and each protrusion including an exposed end uncovered by the sealant.

4. An electronic device including a semiconductor device, the semiconductor device including a semiconductor chip, a die pad on which the semiconductor chip is mounted on one side, and a sealant that seals the semiconductor chip, the semiconductor device comprising:

a plurality of protrusions on part of the die pad, the protrusions being positioned inside and at the corners of a rectangular semiconductor chip mounting area, at least one protrusion in each corner;

each protrusion comprising a convex portion formed by punch forming and projecting away in the direction opposite from the side on which the semiconductor chip is mounted; and each protrusion including an exposed end uncovered by the sealant.

* * * * *